United States Patent
Fan et al.

(10) Patent No.: US 12,084,196 B2
(45) Date of Patent: Sep. 10, 2024

(54) ESTIMATING AVAILABLE POWER FOR AN AIRCRAFT BATTERY

(71) Applicant: Bell Textron Inc., Fort Worth, TX (US)

(72) Inventors: Yue Fan, Fort Worth, TX (US); Michael R. Hull, Fort Worth, TX (US)

(73) Assignee: Textron Innovations Inc., Providence, RI (US)

(*) Notice: Subject to any disclaimer, the term of this patent is extended or adjusted under 35 U.S.C. 154(b) by 164 days.

(21) Appl. No.: 17/404,251

(22) Filed: Aug. 17, 2021

(65) Prior Publication Data

US 2023/0058524 A1 Feb. 23, 2023

(51) Int. Cl.
| | |
|---|---|
| *B64D 45/00* | (2006.01) |
| *G01R 31/382* | (2019.01) |
| *G05D 1/00* | (2006.01) |
| *B60L 58/12* | (2019.01) |
| *B60L 58/16* | (2019.01) |
| *B64C 29/02* | (2006.01) |

(52) U.S. Cl.
CPC .......... *B64D 45/00* (2013.01); *G01R 31/382* (2019.01); *G05D 1/102* (2013.01); *B60L 58/12* (2019.02); *B60L 58/16* (2019.02); *B60L 2200/10* (2013.01); *B64C 29/02* (2013.01); *B64D 2045/0085* (2013.01)

(58) Field of Classification Search
CPC ............ B64D 45/00; B64D 2045/0085; B64D 27/24; B64D 31/00; G01R 31/382; G05D 1/102; B60L 58/12; B60L 58/16; B60L 2200/10; B60L 50/60; B60L 58/13; B60L 58/14; B60L 58/10; B64C 29/02; B64C 29/00; B64U 50/19; B64U 50/30
USPC ........................................................... 701/16
See application file for complete search history.

(56) References Cited

U.S. PATENT DOCUMENTS

| | | | | |
|---|---|---|---|---|
| 7,940,028 | B1* | 5/2011 | Hermann | B60L 58/16 320/150 |
| 8,471,521 | B2* | 6/2013 | Stewart | B60L 53/14 320/132 |
| 10,493,863 | B1* | 12/2019 | Thrun | B64C 29/0091 |
| 10,630,082 | B1* | 4/2020 | Gu | B64F 1/362 |
| 2010/0106346 | A1* | 4/2010 | Badli | G01C 23/00 701/3 |
| 2011/0178648 | A1* | 7/2011 | Calvignac | F02C 7/32 700/291 |

(Continued)

OTHER PUBLICATIONS

EPO Search Report issued in EP Application 21197006.6 mailed Mar. 21, 2022, 4 pages.

*Primary Examiner* — Aryan E Weisenfeld
*Assistant Examiner* — Dominick Mulder
(74) *Attorney, Agent, or Firm* — Akona IP PC (57) ABSTRACT

In an example, a computing apparatus includes a hardware platform, having a processor and a memory, and instructions encoded within the memory to instruct the processor to receive a peak power demand for a landing maneuver of a VTOL aircraft powered at least partly by a battery, receive flight profile data for a flight profile of the VTOL aircraft, and configuration data for the VTOL aircraft, estimate power consumption of the flight profile in context of the configuration, and estimate a peak power capacity available for the landing maneuver, and provide an error notice if the peak power capacity does not meet the peak power demand.

16 Claims, 6 Drawing Sheets

(56) References Cited

U.S. PATENT DOCUMENTS

| | | | | |
|---|---|---|---|---|
| 2014/0152315 | A1* | 6/2014 | LePort | G01R 31/382 |
| | | | | 324/430 |
| 2015/0100181 | A1* | 4/2015 | Strauss | B64C 27/14 |
| | | | | 701/3 |
| 2015/0134174 | A1* | 5/2015 | Preece | H01M 10/44 |
| | | | | 701/22 |
| 2015/0336671 | A1* | 11/2015 | Winn | G05D 1/0094 |
| | | | | 701/3 |
| 2015/0339930 | A1* | 11/2015 | McCann | G08G 5/0013 |
| | | | | 701/528 |
| 2016/0009393 | A1* | 1/2016 | Repp | H04N 23/51 |
| | | | | 254/323 |
| 2017/0274888 | A1* | 9/2017 | Suzuki | B60K 6/445 |
| 2018/0003506 | A1* | 1/2018 | Ghaemi | G06F 7/64 |
| 2018/0044015 | A1* | 2/2018 | Kim | B64U 50/37 |
| 2018/0257784 | A1* | 9/2018 | Simms | B61D 29/00 |
| 2018/0370645 | A1* | 12/2018 | Durand | G05D 1/0676 |
| 2019/0049287 | A1* | 2/2019 | Nance | G01G 19/10 |
| 2019/0235502 | A1* | 8/2019 | Lindsey | B64C 29/00 |
| 2019/0241274 | A1* | 8/2019 | Hunkel | B64D 35/04 |
| 2020/0010188 | A1* | 1/2020 | Fauri | B64C 3/546 |
| 2020/0055419 | A1* | 2/2020 | Kim | B60L 53/68 |
| 2020/0070960 | A1* | 3/2020 | Parker | B64D 31/06 |
| 2020/0277080 | A1 | 9/2020 | Wiegman | |
| 2020/0290742 | A1 | 9/2020 | Kumar et al. | |
| 2020/0339010 | A1* | 10/2020 | Villanueva | H01M 10/625 |
| 2020/0346551 | A1* | 11/2020 | Nestel | H02J 7/007 |
| 2021/0239164 | A1* | 8/2021 | Hellsing | F16D 23/06 |
| 2022/0011782 | A1* | 1/2022 | Mikic | B64C 29/0033 |
| 2022/0250502 | A1* | 8/2022 | Lee | B60L 58/12 |
| 2022/0289395 | A1* | 9/2022 | Matsumoto | B60L 50/61 |
| 2022/0314830 | A1* | 10/2022 | Abe | B60L 3/0046 |

* cited by examiner

ESTIMATING AVAILABLE POWER FOR AN AIRCRAFT BATTERY

TECHNICAL FIELD

This disclosure relates generally to aircraft, and more particularly, to a system and method of providing estimates of available power for a battery in a vertical takeoff and landing ("VTOL") aircraft.

BACKGROUND

Unlike fixed-wing aircraft, VTOL aircraft do not require runways. Instead, VTOL aircraft are capable of taking off, hovering, and landing vertically. One example of VTOL aircraft is a helicopter, which is a rotorcraft having one or more rotors that provide vertical lift and forward thrust to the aircraft. Helicopter rotors not only enable hovering and vertical takeoff and vertical landing, but also enable forward, aftward, and lateral flight. These attributes make helicopters highly versatile for use in congested, isolated or remote areas where fixed-wing aircraft may be unable to take off and land. Helicopters, however, typically lack the forward airspeed of fixed-wing aircraft.

A tiltrotor is another example of a VTOL aircraft. Tiltrotor aircraft utilize tiltable rotor systems that may be transitioned between a forward thrust orientation and a vertical lift orientation. The rotor systems are tiltable relative to one or more fixed wings such that the associated proprotors have a generally horizontal plane of rotation for vertical takeoff, hovering, and vertical landing and a generally vertical plane of rotation for forward flight, or airplane mode, in which the fixed-wing or wings provide lift. In this manner, tiltrotor aircraft combine the vertical lift capability of a helicopter with the speed and range of fixed-wing aircraft. Yet another type of VTOL aircraft is commonly referred to as a "tail-sitter." As the name implies, a tail-sitter takes off and lands on its tail, but tilts horizontally for forward flight.

VTOL aircraft may be manned or unmanned. An unmanned aerial vehicle ("UAV"), also commonly referred to as a "drone," is an aircraft without a human pilot aboard. UAVs may be used to perform a variety of tasks, including filming, package delivery, surveillance, and other applications. A UAV typically forms a part of an unmanned aircraft system ("UAS") that includes the UAV, a ground-based controller, and a system of communication between the vehicle and controller.

SUMMARY

One embodiment is an aircraft including at least one propulsion assembly; a cargo area for receiving payload to be transported by the aircraft; and a control system for determining characteristics of the received payload; automatically determining optimal control gains for operating the aircraft including the payload based on the determined payload characteristics; and providing control signals to at least one of the at least one propulsion assembly and a control assembly of the aircraft to control operation of the at least one propulsion assembly in accordance with the determined optimal control gains.

BRIEF DESCRIPTION OF THE DRAWINGS

To provide a more complete understanding of the present disclosure and features and advantages thereof, reference is made to the following description, taken in conjunction with the accompanying FIGURES, in which like reference numerals represent like elements.

DETAILED DESCRIPTION

The following disclosure describes various illustrative embodiments and examples for implementing the features and functionality of the present disclosure. While particular components, arrangements, and/or features are described below in connection with various example embodiments, these are merely examples used to simplify the present disclosure and are not intended to be limiting. It will of course be appreciated that in the development of any actual embodiment, numerous implementation-specific decisions may be made to achieve the developer's specific goals, including compliance with system, business, and/or legal constraints, which may vary from one implementation to another. Moreover, it will be appreciated that, while such a development effort might be complex and time-consuming, it would nevertheless be a routine undertaking for those of ordinary skill in the art having the benefit of this disclosure.

While the making and using of various embodiments of the present disclosure are discussed in detail below, it should be appreciated that the present disclosure provides many applicable inventive concepts, which can be embodied in a wide variety of specific contexts. The specific embodiments discussed herein are merely illustrative and do not delimit the scope of the present disclosure. In the interest of clarity, not all features of an actual implementation may be described in the present disclosure.

In the specification, reference may be made to the spatial relationships between various components and to the spatial orientation of various aspects of components as depicted in the attached drawings. However, as will be recognized by those skilled in the art after a complete reading of the present disclosure, the devices, components, members, apparatuses, etc. described herein may be positioned in any desired orientation. Thus, the use of terms such as "above," "below," "upper," "lower," "top," "bottom," or other similar terms to describe a spatial relationship between various components or to describe the spatial orientation of aspects of such components, should be understood to describe a relative relationship between the components or a spatial orientation of aspects of such components, respectively, as the components described herein may be oriented in any desired direction. When used to describe a range of dimensions or other characteristics (e.g., time, pressure, temperature) of an element, operations, and/or conditions, the phrase "between X and Y" represents a range that includes X and Y.

Further, as referred to herein in this specification, the terms "forward," "aft," "inboard," and "outboard" may be used to describe relative relationship(s) between components and/or spatial orientation of aspect(s) of a component or components. The term "forward" may refer to a special direction that is closer to a front of an aircraft relative to another component or component aspect(s). The term "aft" may refer to a special direction that is closer to a rear of an aircraft relative to another component or component aspect(s). The term "inboard" may refer to a location of a component that is within the fuselage of an aircraft and/or a spatial direction that is closer to or along a centerline of the aircraft relative to another component or component aspect(s), wherein the centerline runs in a between the front and the rear of the aircraft. The term "outboard" may refer to a location of a component that is outside the fuselage—of an aircraft and/or a special direction that farther from the centerline of the aircraft relative to another component or component aspect(s).

Still further, the present disclosure may repeat reference numerals and/or letters in the various examples. This repetition is for the purpose of simplicity and clarity and does not in itself dictate a relationship between the various embodiments and/or configurations discussed.

Aircraft, including rotary, other vertical takeoff and landing (VTOL) aircraft, and fixed-wing aircraft, may use batteries as a primary power source, or as an auxiliary power source, in addition to a more traditional motive means, such as an engine. While such batteries have theoretical or published optimal voltage and power ratings, in practice these values are not constant. In particular, two factors that have a substantial impact on power output include the remaining charge on the battery, and the operating temperature. As temperature increases, the chemical reactions that provide power in the battery become more active, and thereby provide greater power. As the battery becomes colder, the chemical reactions are somewhat inhibited, and the battery provides lower power density. Similarly, the greater the remaining charge on the battery, the greater its available power density. The lower the remaining charge, the less the available power density.

With respect to operating temperature, a lower threshold may be defined below which the battery is not able to provide enough power to perform its intended function. A first upper threshold may also be defined, above which the battery delivers sufficient power density, but at which there is also a long-term impact on the battery, such as changes in discharge and recharge cycles. Between these two thresholds, there is a desired operational window, in which the battery delivers sufficient power density, yet does not become so hot that there are long-term degradation effects. A second upper threshold may further be defined, above which catastrophic failure may occur, such as possible runaway chemical reactions in the battery, which may cause it to fail quickly or even to catch fire.

In an illustrative embodiment, an aircraft such as an electric VTOL (eVTOL) aircraft may have a battery such as a lithium-ion battery. A lithium-ion battery may have a power delivery capability that generally decreases as energy is consumed. As energy is consumed from the battery, the terminal voltage of the battery decreases, and the peak power capability generally varies based on numerous battery state factors such as the state of charge (SOC), state of health (SOH) of the battery, temperature, internal impedance, and acceptable voltage ranges for the load or loads.

Thus, for example, the SOC can be an important factor in-flight planning for a rotary or VTOL aircraft battery. A rotary aircraft or other VTOL aircraft may, in particular, have a high power demand during takeoff and landing. These are times when the battery may need to deliver high peak power loads to power hovering, with little or no forward translation. Similarly, SOH is important because internal impedance degrades with age, requiring reliable, real-time calculations for effective flight planning.

Embodiments of the present specification provide a system, method, and apparatus for predicting landing power demands based on a variety of inputs, and estimating the existing energy on a battery. This can help in mission planning, such as by predicting whether a particular mission profile will result in a high enough remaining charge on the battery to perform the landing maneuver. Predictive iterations may also occur in-flight, and may be used to account for, for example, deviations from the predicted flight plan, or other variations such as changes in headwind, wind resistance, speed, altitude, or other unplanned deviations.

This system realizes advantages over some existing embodiments, which may provide a remaining charge indicator, similar to a fuel gauge. In a traditional aircraft powered by an engine, the fuel gauge indicates how much fuel is left. However, this analogy does not necessarily hold for battery-operated aircraft, because the remaining SOC can actually affect the ability of the battery to deliver a peak power demand. Thus, a traditional fuel gauge that simply measures the state of charge may be inadequate to meet the demands of an eVTOL aircraft. Similarly, electric cars may provide a range estimation based on instantaneous power and average power. However, unlike an electric car, an eVTOL aircraft has a surge-like power demand at landing. Thus, the battery state at the end of a trip must be sufficient to meet those power demands.

In particular, there may be a situation where an eVTOL aircraft has a battery with enough charge (e.g., in watt-hours) to theoretically complete its mission profile. But because of the discharge of the battery and the lower terminal voltage, delivering the same instantaneous power may require the battery to drive a higher current. Thus, although the battery may have sufficient watt-hours stored to theoretically complete its mission profile, it may not have sufficient power density remaining to deliver the instantaneous power demand (in watts) to perform a landing maneuver. This may result in a rough landing, a non-optimal landing, or even a catastrophic failure or crash. Depending on whether the aircraft is manned, the latter could even result in injury or loss of life.

It is therefore desirable to accurately predict the remaining power and power density in an eVTOL aircraft. This may include predicting the landing power based on an existing energy estimation. Such prediction could be carried out before flight, to provide a preflight profile that can be used for mission planning, and can determine whether the aircraft is capable of fully carrying out its tasked mission, or whether reconfiguration is necessary. Predictions may also be provided in-flight, and can be used to predict whether the aircraft has the ability to complete its planned flight in view of the original mission profile, and also in view of any adjustments that may be necessary due to unpredicted factors, such as variations in speed, altitude, air density, headwind, tailwind, flight traffic patterns, and other unpredicted factors.

The present specification provides a controller that may be used to predict or estimate a mission profile, including the remaining SOC at landing. This can be used to plan for a mission, or to successfully carry out a mission. The controller may include any suitable hardware platform, for example, a processor circuit, which could be a central processing unit (CPU), graphics processing unit (GPU), microcontroller, field-programmable gate array (FPGA), application-specific integrated circuit (ASIC), or other programmable circuit. In cases where the circuit is software-programmable (e.g., such as in the case of a CPU or GPU), then the circuit may include instructions stored on a memory, which may be a volatile or nonvolatile memory. These instructions, when loaded by the processor circuit and executed by the processor circuit, instruct the processor circuit to carry out various methods as disclosed herein. Embodiments of the described system, method, and apparatus may also include one or more transitory or non-transitory computer-readable storage media, having stored thereon executable instructions to instruct a processor circuit to carry out certain methods. The processor circuit or computer-readable media may be stored either on the aircraft (e.g., for prediction before flight or during flight), or offboard of the aircraft (e.g., for mission planning).

An embodiment of the controller uses predefined inputs of aircraft landing power and energy needs to predict usable energy remaining at the end of the flight. The controller may calculate the SOC after completing a predicted landing maneuver. The controller may use an iterative process to determine at which power state a landing maneuver will leave the battery or batteries with only reserve energy and power. The accuracy of usable energy remaining may be improved over a conventional SOC or a fixed C-rate estimator, where C-rate represents the rate at which a battery is discharged relative to its maximum capacity.

These computations can also be used to more nearly optimize flight planning and eVTOL operation.

The foregoing can be used to build or embody several example implementations according to the teachings of the present specification. Some example implementations are included here as nonlimiting illustrations of these teachings.

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions. One general aspect includes a computing apparatus. The computing apparatus also includes a hardware platform, may include a processor and a memory. The apparatus also includes instructions encoded within the memory to instruct the processor to receive a peak power demand for a landing maneuver of a VTOL aircraft powered at least partly by a battery. The apparatus also includes receive flight profile data for a flight profile of the VTOL aircraft, and configuration data for the VTOL aircraft. The apparatus also includes estimate power consumption of the flight profile in context of the configuration, and estimate a peak power capacity available for the landing maneuver. The apparatus also includes provide an error notice if the peak power capacity does not meet the peak power demand. Other embodiments of this aspect include corresponding computer systems, apparatus, and computer programs recorded on one or more computer storage devices, each configured to perform the actions of the methods.

Implementations may include one or more of the following features. The computing apparatus where the peak power demand includes a safety margin. Estimating power consumption may include a reverse energy integration. The reverse energy integration may include: starting with a state of charge predicted to provide the peak power demand; working backward through the flight profile to reach an estimated starting state of charge; and providing the error notice if the estimated starting state of charge is greater than an actual state of charge. The flight profile data are preflight data. The flight profile data are in-flight data. Estimating peak power capacity may include accounting for battery state of health. The flight profile data may include real or predicted operating temperature. The flight profile data may include payload data. Estimating peak power capacity may include accounting for internal battery impedance. The internal battery impedance accounts for temperature, state of charge, and state of health. Accounting for internal battery impedance may include querying a lookup table. Accounting for internal battery impedance may include applying a numeric model. The error notice may include a preflight notification that a planned flight does not meet a power demand. The error notice may include an in-flight notification that the flight profile cannot be safely completed. Implementations of the described techniques may include hardware, a method or process, or computer software on a computer-accessible medium.

One general aspect includes one or more tangible. The non-transitory computer-readable storage media also includes instructions that receive, for a VTOL aircraft and an associated battery, battery data, flight profile data for a flight profile of the VTOL aircraft, and flight configuration data for the VTOL aircraft. The media also includes receive, for the flight profile data, an associated peak power demand for a landing maneuver. The media also includes instructions to estimate a peak power capacity of the battery during the landing maneuver, according to battery data, the flight profile data, and flight configuration data. The media also includes instructions to determine whether the flight profile can be successfully completed may include comparing the peak power capacity to the peak power demand. The media also includes act on the determination. Other embodiments of this aspect include corresponding computer systems, apparatus, and computer programs recorded on one or more computer storage devices, each configured to perform the actions of the methods.

Implementations may include one or more of the following features. The one or more tangible, non-transitory computer-readable media where determining whether the flight profile can be successfully completed may include accounting for a safety margin. Estimating the peak power capacity may include a reverse energy integration. The reverse energy integration may include: starting with a state of charge predicted to provide the peak power demand; working backward through the flight profile to reach an estimated starting state of charge; and providing an error notice if the estimated starting state of charge is greater than an actual state of charge. The flight profile data are preflight data. The flight profile data are in-flight data. Estimating peak power capacity may include accounting for battery state of health. The flight profile data may include a real or predicted operating temperature. The flight profile data may include payload data. Estimating peak power capacity may include accounting for internal battery impedance. The internal battery impedance accounts for temperature, state of charge, and state of health. Accounting for internal battery impedance may include querying a lookup table. Accounting for internal battery impedance may include applying a numeric model. Determining whether the flight profile can be successfully completed may include providing a preflight notification that a planned flight does not meet a power demand. Determining whether the flight profile can be successfully completed may include providing an in-flight notification that the flight profile cannot be safely completed. Implementations of the described techniques may include hardware, a method or process, or computer software on a computer-accessible medium.

One general aspect includes a computer-implemented method. The computer-implemented method also includes receiving, for a VTOL aircraft and a battery for the VTOL aircraft, battery data, flight profile data, and flight configuration data. The method also includes receiving, for the flight profile data, an associated peak power demand on the battery for a landing maneuver of the VTOL aircraft. The method also includes predicting a peak power capacity of the battery available for the landing maneuver, according to battery data, the flight profile data, and flight configuration data. The method also includes determining whether the peak power capacity of the battery can meet the peak power demand for the landing maneuver. The method also includes if it is predicted that the peak power capacity of the battery cannot meet the peak power demand, providing an error notification. Other embodiments of this aspect include corresponding computer systems, apparatus, and computer programs recorded on one or more computer storage devices, each configured to perform the actions of the methods.

Implementations may include one or more of the following features. The method where the peak power demand includes a safety margin. The flight profile data are preflight data. The flight profile data are in-flight data. Estimating peak power capacity may include accounting for battery state of health. The flight profile data may include real or predicted operating temperature. The flight profile data may include payload data. Predicting peak power capacity may include accounting for internal battery impedance. The internal battery impedance accounts for temperature, state of charge, and state of health. Accounting for internal battery impedance may include querying a lookup table. Implementations of the described techniques may include hardware, a method or process, or computer software on a computer-accessible medium.

A system and method for estimating available power for an aircraft battery will now be described with more particular reference to the attached FIGURES. It should be noted that throughout the FIGURES, certain reference numerals may be repeated to indicate that a particular device or block is referenced multiple times across several FIGURES. In other cases, similar elements may be given new numbers in different FIGURES. Neither of these practices is intended to require a particular relationship between the various embodiments disclosed. In certain examples, a genus or class of elements may be referred to by a reference numeral ("widget 10"), while individual species or examples of the element may be referred to by a hyphenated numeral ("first specific widget 10-1" and "second specific widget 10-2").

Figure 1:
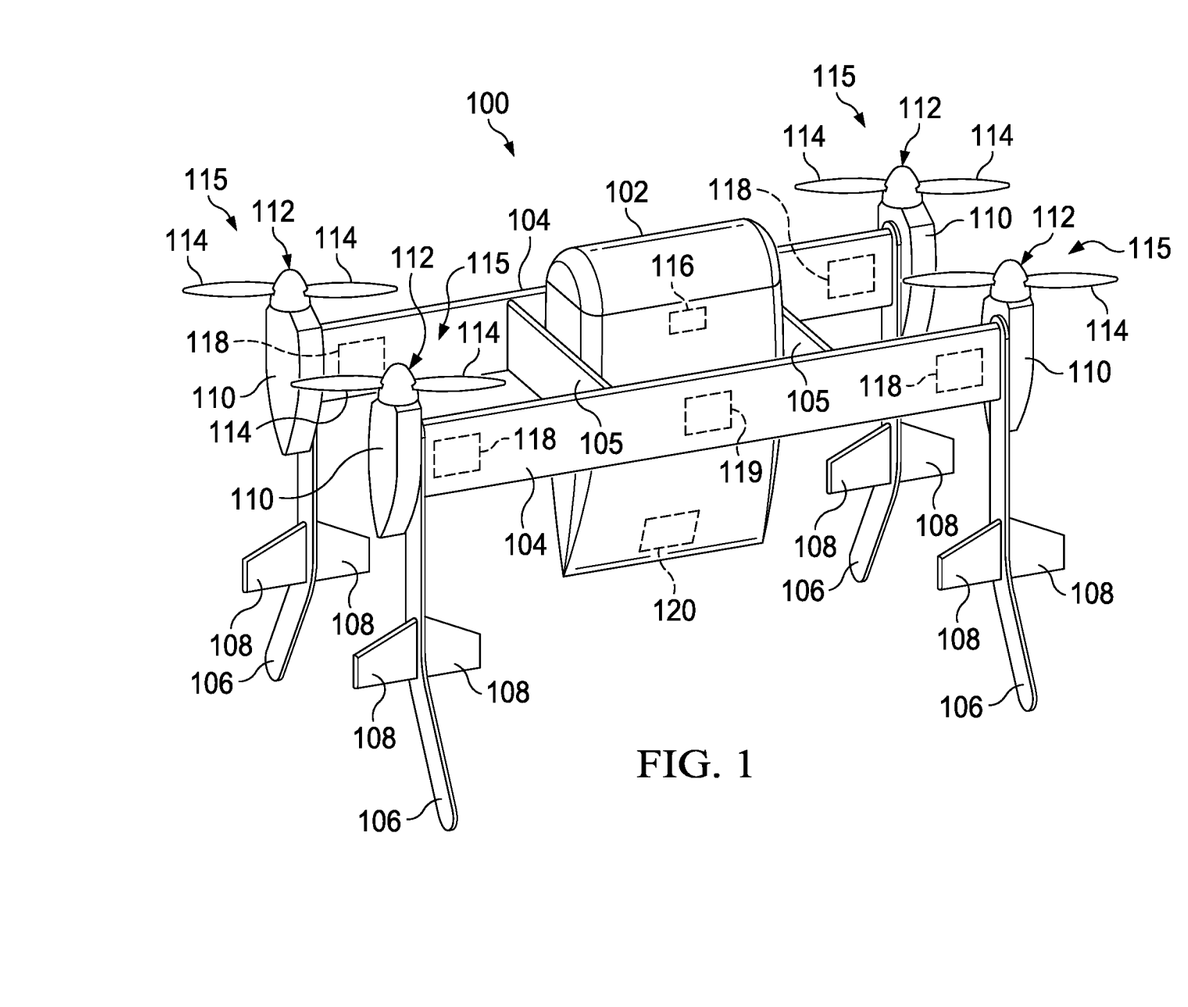
FIG. 1 is an oblique view of an aircraft configured for operation in a helicopter flight mode in accordance with embodiments described herein.
Figure 2:
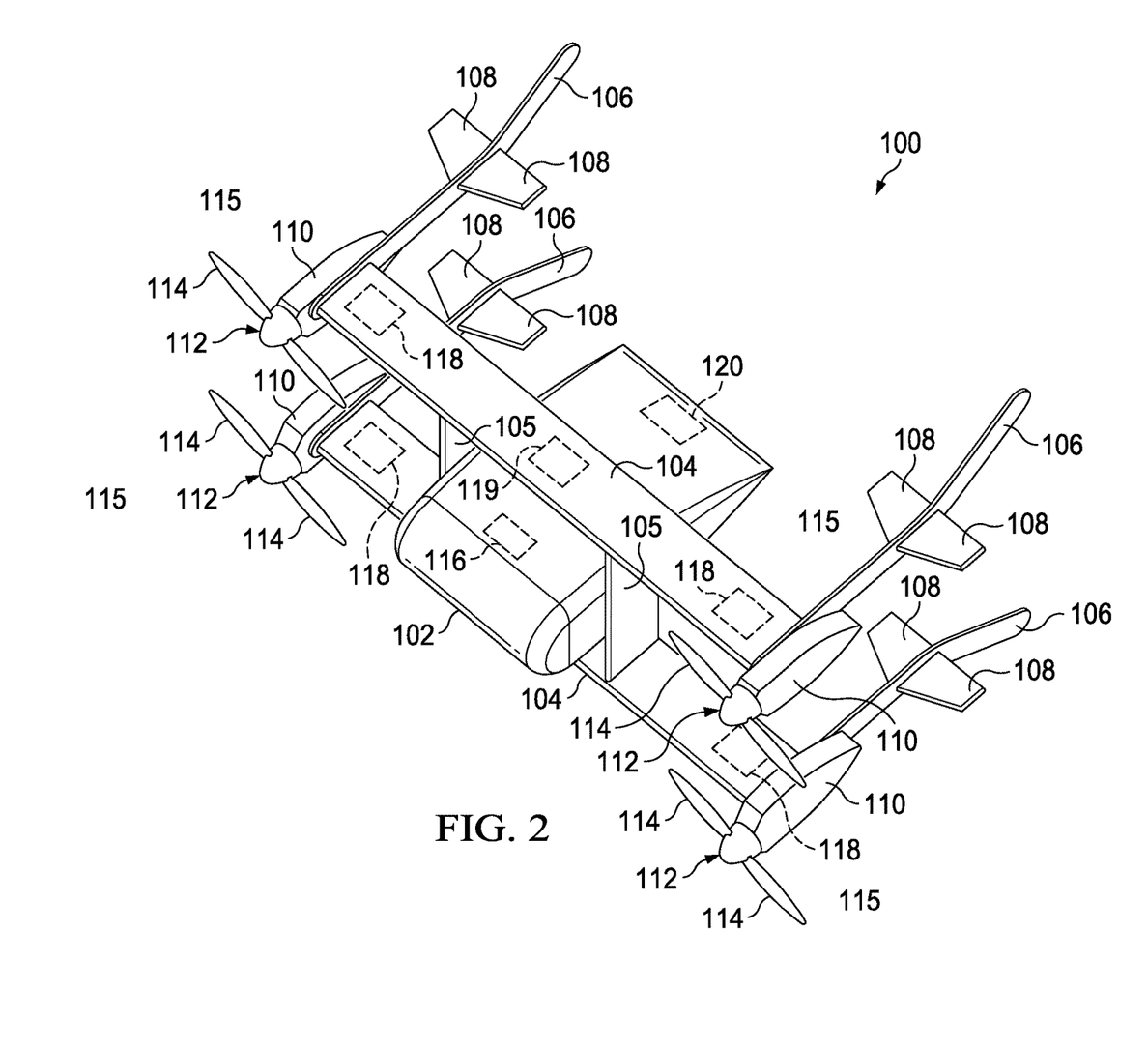
FIG. 2 is an oblique view of the aircraft of FIG. 1 configured for operation in an airplane flight mode in accordance with embodiments described herein.

Referring now to FIGS. 1 and 2, oblique views of an aircraft 100 are shown according to this disclosure. Aircraft 100 is generally configured as a VTOL aircraft, more specifically an autonomous pod transport ("APT") convertible drone aircraft, that is operable in a helicopter mode (shown in FIG. 1) associated with vertical takeoff from and landing to a landing zone, hover, and sideward and rearward mobility or flight, and an airplane mode (shown in FIG. 2) associated with forward flight. Additionally, since aircraft 100 is a convertible aircraft, it is also operable in a conversion mode when transitioning between the helicopter and airplane modes. Further, being a drone-type aircraft, aircraft 100 is configured for remote control and operation. Additionally, at least in some embodiments, aircraft 100 may be fully made autonomous and self-directed via a predetermined or preprogrammed location-based guidance system (e.g., global positioning system ("GPS"), coordinate-based location, street address, etc.).

Aircraft 100 comprises a battery compartment 102, biplane wings 104, vertical supports 105 disposed between the wings 104, tail booms 106, horizontal stabilizers 108 extending from each tail boom 106, and a plurality of pylons 110 each comprising a rotor system 112 having a plurality of rotor blades 114. Each combination of a pylon 110 and its associated rotor system 112 comprising rotor blades 114 may be referred to herein as a propulsion assembly 115. Aircraft 100 also comprises a payload sensor 116, a plurality of aircraft sensors 118, an orientation sensor 119, and a battery 120. Wings 104 comprise a substantially parallel, double-wing configuration that provides lift to the aircraft 100 during forward flight while also maintaining a smaller footprint of the aircraft 100 when the aircraft 100 is on the ground. Vertical supports 105 are disposed on each side of the battery compartment 102 and affixed between the wings 104 to provide structure and support to the wings 104. The battery compartment 102 is generally positioned between the wings 104 and the vertical supports 105. In the embodiment shown, the battery compartment 102 is affixed to the vertical supports 105. However, in other embodiments, the battery compartment 102 may be affixed to the wings 104 or both the wings 104 and vertical supports 105. Additionally, while two vertical supports 105 are shown, in some embodiments, aircraft 100 may comprise more vertical supports 105 depending on the configuration of the aircraft 100.

Tail booms 106 are disposed on the outboard ends of each wing 104. The tail booms 106 are curved at the aft ends to provide stabilization to the aircraft 100 during forward flight in a manner substantially similar as other tail surfaces known in the art, while also doubling as a landing gear for the aircraft 100. As such the curved ends of the tail booms 106 provide a wider base for the landing gear. Each tail boom 106 also comprises a pair of horizontal stabilizers 108 coupled to each of an inner and outer surface of the tail boom 106. The horizontal stabilizers 108 function to provide stabilization to the aircraft 100 during forward flight in a manner substantially similar as horizontal stabilizers known in the art. Pylons 110 are disposed on outboard sides of each tail boom 106 proximate the outboard end of each wing 104. Each pylon 110 comprises a selectively rotatable rotor system 112 having a plurality of rotor blades 114 coupled thereto. In the embodiment shown, each rotor system 112 is driven by an associated electric motor. However, in other embodiments, the rotor systems 112 may be driven by a combustion engines or auxiliary power unit through a plurality of interconnect driveshafts and/or auxiliary gearboxes. Furthermore, since aircraft 100 functions as a convertible aircraft, the rotational speeds of each rotor system 112 may be selectively controlled to orient aircraft 100 in the various flight modes.

Whereas FIGS. 1 and 2 disclose an illustrative embodiment wherein an unmanned drone aircraft is provided, other configurations are possible. For example, the Bell Helicopter provides rotary models such as the Bell 206, Bell 407, Bell 427, and Bell 505, by way of illustrative and nonlimiting example. Other manufacturers provide other models of similar rotary/VTOL aircraft. Although these are not designed originally to be battery powered, it is possible to modify them to operate from a battery, or to create similar model aircraft that are fully or partially battery powered. Furthermore, the V-22 Osprey and its variants (also manufactured by Bell) is a tiltrotor aircraft that is not originally designed to be battery powered. However, fully or partially battery powered variants or derivatives are possible, or other similar battery powered tiltrotor aircraft. Any of these may benefit from the teachings of this specification. Furthermore, any use case in which a power "spike" is required of a battery at the end of an operational profile may benefit from these teachings.

Figure 3:
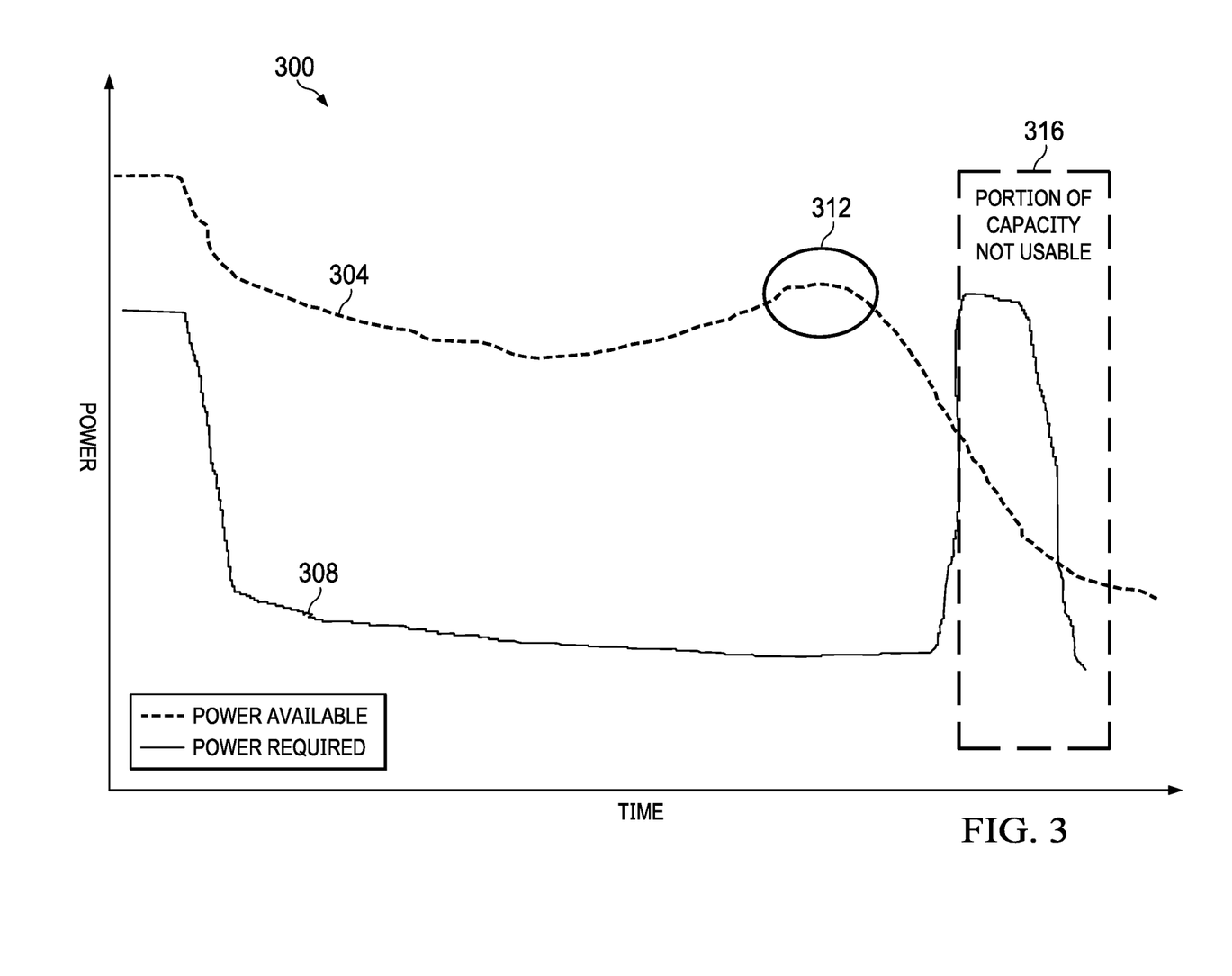
FIG. 3 is a graph illustrating a power profile for an aircraft battery over a flight.

FIG. 3 is a graph 300 illustrating a power profile for an aircraft battery over a flight. Line 304 illustrates the battery available peak power over flight time, while line 308 illustrates the battery peak power demand over the course of the flight. As this line illustrates, as the flight starts, the battery starts with its maximum available power, and therefore has its maximum theoretical power density. As the flight continues, the battery discharges. As the battery discharges, the SOC decreases, and the terminal voltage therefore decreases. As the terminal voltage decreases, the amount of current needed to deliver a unit power increases. Therefore, over time, the battery's peak power capacity decreases. At node 312, it can be observed that a slight "bump" occurs at a later flight time. This bump may occur because, as the battery discharges, the battery heats up. As the battery heats, its chemical reactions become more energetic, and therefore, the warmer battery is able to deliver higher peak power. However, after the slight bump at 312, the peak power capacity decreases very quickly.

Comparing peak power capacity line 304 to aircraft power demand line 308, it can be seen that FIG. 3 provides a flight profile that cannot be successfully completed. Flight line 308 begins with a large power surge at takeoff. The power demand then essentially levels off, as the eVTOL aircraft maintains essentially level flight for most of its flight profile. However, block 316 represents a landing maneuver. Like the takeoff maneuver, the landing maneuver may require a relatively large peak capacity, which looks like a power surge. This peak demand will exceed the available peak power capacity on line 304. Thus, the flight profile will not be successfully completed, and the aircraft may experience undesired conditions, or may even fail.

It is therefore desirable to more nearly optimize the battery's peak power delivery capacity to the flight profile's peak power demand.

Figure 4:
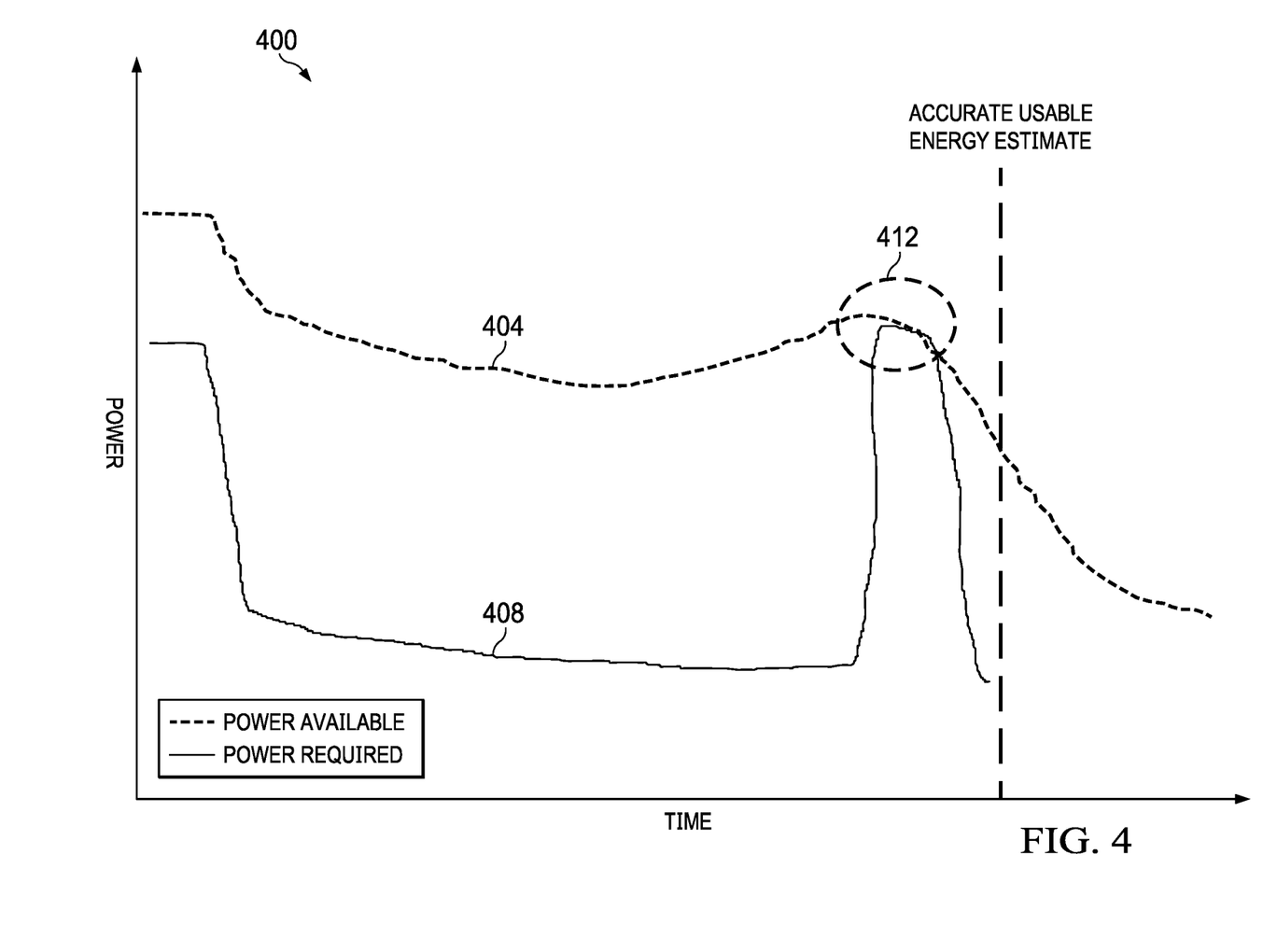
FIG. 4 is a graph illustrating a power profile for an aircraft battery over a flight.

FIG. 4 is a graph 400 including a peak power capacity line 404 and an aircraft peak power demand line 408. As before, the peak power capacity of the battery generally degrades over the time of flight, but there is again a slight bump in peak power capacity at node 412, where heating of the battery results in a more energetic chemical reaction, and therefore, the peak power capacity of the battery is temporarily increased. After node 412, the peak power capacity degrades very quickly.

In this case, flight profile 408 has been planned so that the peak power demand of the eVTOL aircraft essentially coincides with the bump in power capacity at node 412. This represents good mission planning, and if the flight profile is followed, the aircraft will be able to complete its mission. Planning the landing maneuver with its high instantaneous power demand to coincide with a bump in power capacity resulting from heating of the battery is one option. However, other options are also possible, including planning a peak power demand that falls at any point where the power demand is not lower than the peak power capacity of the battery.

Figure 5:
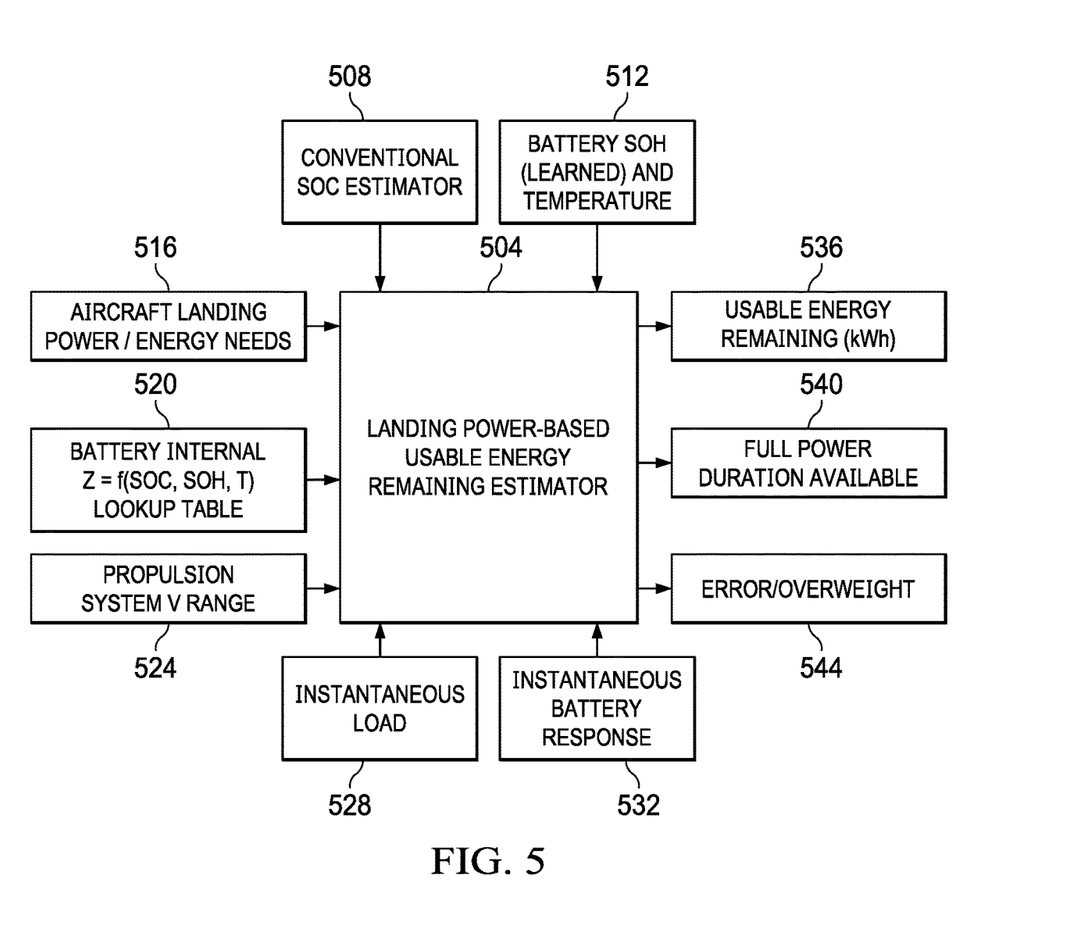
FIG. 5 is a block diagram of an estimator function.

FIG. 5 is a block diagram of an estimator function 504 which may be, for example, a hardware or software module of a controller, as described herein. Estimator function 504 provides a landing power based usable energy remaining estimator. This can be used for mission planning, and/or for mission completion in-flight. Estimator function 504 receives various inputs to compute a number of outputs. Inputs may include the following, by way of illustrative and nonlimiting example.

Estimator function 504 may include a conventional SOC estimator 508 and a learned battery SOH metric 512. SOC estimator 508 may include a lookup table or conventional model that provides inputs such as, for example, the terminal voltage at various states of charge, which affects the power density of the battery. Learned battery SOH metric 512 may provide inputs based on temperature, and may be learned from experience with batteries.

Input block 516 provides aircraft landing power and energy needs, which may be based on learned experience about how much peak power the aircraft draws during a landing maneuver.

Input block 520 is a battery internal impedance. Battery internal impedance is a function of SOC, SOH, and current temperature. Although this can be a mathematical model, it may also be simplified into a lookup table.

Input block 524 includes a propulsion system voltage range. Generally, a propulsion system may work across a range of voltages. This can account for, among other things, variations in the terminal voltage of the battery as it discharges. However, at some voltage ranges, the power supply may not function properly. For example, the power supply could run out of duty cycle headroom. Thus, even among the nominal operational voltages of the propulsion system, there may be ranges in which the system doesn't work, or ranges in which it works better than in other ranges.

Input block 528 is an instantaneous load input. This could be useful, for example, in the case of an onboard controller that is performing real-time calculations during flight. The instantaneous load may be used to update the performance profile of the system, and to update calculations of peak power demands.

Input block 532 is an instantaneous battery response. This may also be used in a real-time control system. For example, the instantaneous battery response may vary from the predicted battery response. In the case of a variance, the instantaneous or real-time updates may need to be made to the estimates, and to the flight profile.

Estimator function 504 may provide a variety of outputs. These include usable energy remaining 536. This may be a usable energy remaining measurement in kilowatt hours, but it is not simply a measure of the remaining charge stored on the battery. Rather, usable energy remaining 536 may account for a necessary landing maneuver, and thus indicates the actual usable energy in view of the overall flight power.

Block 540 may include an estimate of the full power duration available. For example, this estimate may be a time that the aircraft can continue with full power flight. This estimate can be compared to the mission profile, and can be used to determine whether the aircraft can complete its planned mission.

Block 544 may include an error or overweight indication. For example, if the current calculation indicates that the aircraft cannot complete its mission profile using the existing parameters, then an error condition may arise. If this occurs in preplanning, then the aircraft configuration and/or flight plan can be altered. For example, the aircraft could be sent on a shorter flight, the altitude could be changed, the path could be changed, additional batteries could be added, cargo could be removed, or other changes could be made. If an error or overweight condition occurs in-flight, then emergency adjustments may need to be made to the flight plan. For example, a pilot or controller may select a closer landing site, may land the aircraft early, may alter weight or ballast levels, or make other adjustments as necessary.

Figure 6:
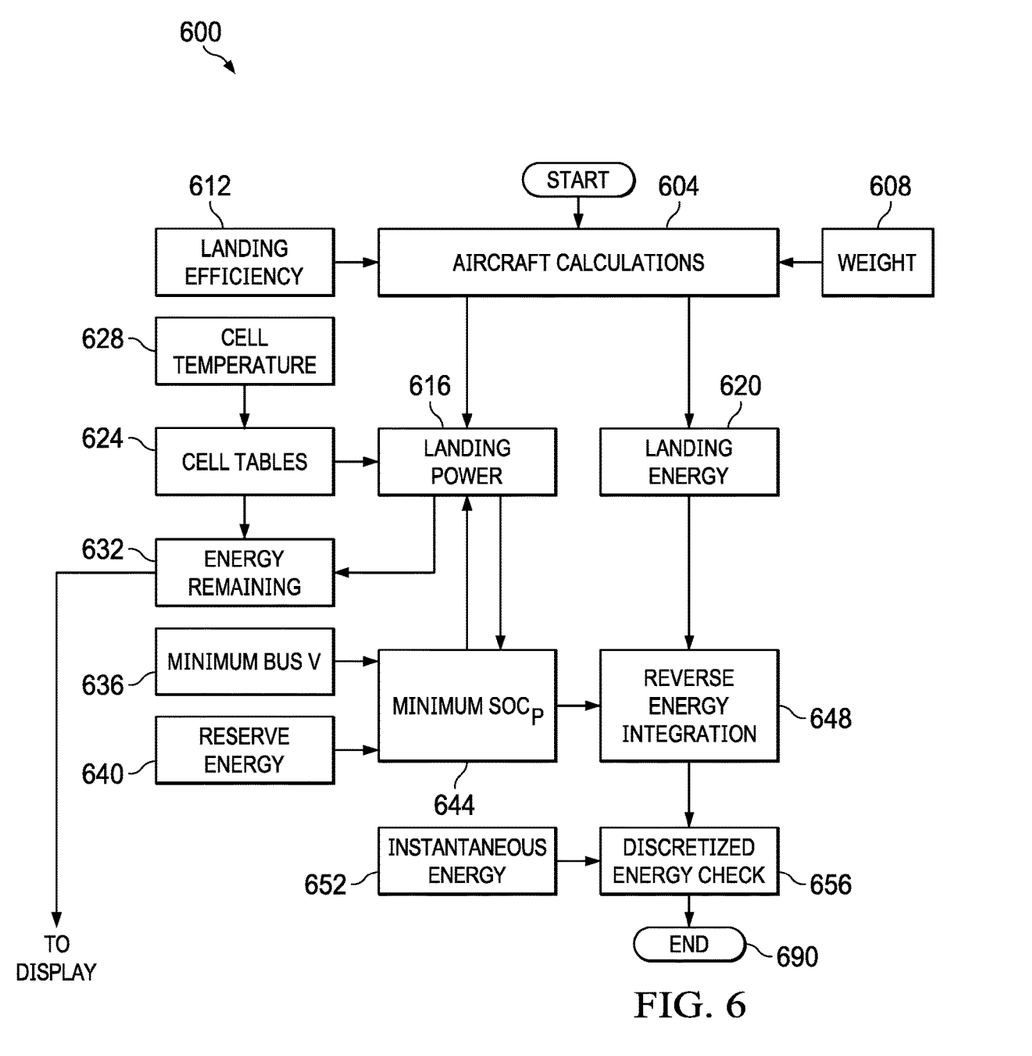
FIG. 6 is a flowchart of a method.

FIG. 6 is a flowchart of a method 600. Method 600 may be used to perform the estimation and calculation to determine an aircraft's capability, and in particular, its ability to perform landing maneuvers in view of its peak power demand.

Block 604 is a composite block that receives aircraft calculations. This includes aircraft weight 608. Aircraft calculations 604 also includes landing efficiency 612. Landing efficiency 612 may be based on a lookup table or a formula, and determines for a given weight and rotor type, the power and energy demands for a landing maneuver. This could also account for other factors, such as landing altitude, landing surface, landing facilities, and similar.

Aircraft calculations 604 provides as output at least two computations, namely, landing power 616 and landing energy 620. These are calculated as the peak power necessary to land, and the stored energy necessary to land.

Landing power 616 includes various inputs, such as a cell table 624. Cell table 624 may be based in part on cell temperature 628, and may include a table of the power capability of the cells. For example, based on the temperature and SOC, the table may indicate a maximum available power for the battery cell. Cell table 624 provides the indicated value to landing power block 616.

A minimum bus voltage 636 and available reserve energy 640 may be inputs to a minimum SOC computation 644. Minimum SOC computation 644 indicates the minimum SOC necessary to perform the aircraft profile or mission. The minimum SOC computation 644 communicates in a feedback configuration with landing power 616.

Minimum SOC 644 is also provided to a reverse energy integration block 648. Reverse energy integration block 648 receives the landing energy needs 620, and the minimum SOC 644. The reserve energy integration block 648 then iteratively works backward from a low charge state to find a minimum value where the aircraft is able to perform its mission function without failing.

By way of illustrative example, the reverse integration may start with a final state of charge required to meet the peak power demand at the landing maneuver, which may account for battery state data, such as state of health, the predicted operating temperature at the landing maneuver, or other information. The system may then work backward through the flight profile, such as in discrete increments, to reach an estimated starting state of charge that is necessary to leave the battery with the desired final state of charge at landing. This yields a predicted starting state of charge necessary to complete the flight profile, including the landing maneuver. This may account for such factors as loadout of the aircraft (e.g., aircraft configuration), the number of batteries available, the predicted flight altitude and duration, the predicted operating temperature at various points throughout the flight, and other factors. This provides essentially a reverse simulation of the flight, and yields a desired starting state of charge that will complete the flight profile (optionally, within a safety margin). This starting state of charge can then be compared with the actual state of charge of the battery, either preflight, or during flight (if the system needs to determine whether a flight in progress can be safely completed).

If the actual starting or current state of charge does not meet the requirement, then an error notice or notification may be provided. For example, this could be in the form of a preflight warning that the current flight configuration and flight profile are incompatible. The operator can then make changes, such as altering the flight profile, altering the loadout, providing additional batteries, or others. In the case of an in-flight prediction that the battery cannot be successfully completed, a warning can be provided to the pilot, remote operator, or autonomous electronic controller (which can all be called, in general, an operator). The operator can then make a decision, such as whether to attempt to complete the flight, or whether to change the flight profile, for example, by selecting a closer landing option.

The result of the reverse energy integration 648, along with the instantaneous usable energy of battery 652, may be provided to discretized energy check 656, which provides a real-time display update. For example, discretized energy check 656 may check the energy at given intervals to determine what the remaining energy is, and whether the remaining energy is sufficient to perform a mission profile. As described above, this can be done either in a preplanning phase for the flight, or in real-time during the flight, to determine whether the mission can be safely completed.

In some embodiments, a separate landing battery is provided, which provides a reserve energy specifically for landing. If a separate landing battery is provided, then the landing battery and its parameters can also be included in the computations of the present specification, and managed appropriately. For example, if the landing battery provides power on its own, then computations may be made to ensure that the landing battery is not discharged before the landing maneuver. In other cases, the landing battery is actually used to slightly recharge the main battery, in which case there may need to be computations concerning when to begin recharging the main battery, and how aggressively to recharge the main battery with the landing battery.

In block 690, the method is done.

At least one embodiment is disclosed, and variations, combinations, and/or modifications of the embodiment(s) and/or features of the embodiment(s) made by a person having ordinary skill in the art are within the scope of this disclosure. Alternative embodiments that result from combining, integrating, and/or omitting features of the embodiment(s) are also within the scope of this disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, Rl, and an upper limit, Ru, is disclosed, any number falling within the range is specifically disclosed. In particular, the following numbers within the range are specifically disclosed: R=Rl+k*(Ru-Rl), wherein k is a variable ranging from 1 percent to 100 percent with a 1 percent increment, i.e., k is 1 percent, 2 percent, 3 percent, 4 percent, 5 percent, . . . , 50 percent, 51 percent, 52 percent, . . . , 95 percent, 96 percent, 95 percent, 98 percent, 99 percent, or 100 percent. Moreover, any numerical range defined by two R numbers as defined in the above is also specifically disclosed. Use of the term "optionally" with respect to any element of a claim means that the element is required, or alternatively, the element is not required, both alternatives being within the scope of the claim. Use of broader terms such as comprises, includes, and having should be understood to provide support for narrower terms such as consisting of, consisting essentially of, and comprised substantially of. Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present invention. Also, the phrases "at least one of A, B, and C" and "A and/or B and/or C" should each be interpreted to include only A, only B, only C, or any combination of A, B, and C.

Although several embodiments have been illustrated and described in detail, numerous other changes, substitutions, variations, alterations, and/or modifications are possible without departing from the spirit and scope of the present invention, as defined by the appended claims. The particular embodiments described herein are illustrative only and may be modified and practiced in different but equivalent manners, as would be apparent to those of ordinary skill in the art having the benefit of the teachings herein. Those of ordinary skill in the art would appreciate that the present disclosure may be readily used as a basis for designing or modifying other embodiments for carrying out the same purposes and/or achieving the same advantages of the embodiments introduced herein. For example, certain embodiments may be implemented using more, less, and/or other components than those described herein. Moreover, in certain embodiments, some components may be implemented separately, consolidated into one or more integrated components, and/or omitted. Similarly, methods associated with certain embodiments may be implemented using more, less, and/or other steps than those described herein, and their steps may be performed in any suitable order.

Numerous other changes, substitutions, variations, alterations, and modifications may be ascertained to one of ordinary skill in the art and it is intended that the present disclosure encompass all such changes, substitutions, variations, alterations, and modifications as falling within the scope of the appended claims.

What is claimed is:

1. A computing apparatus, comprising:
   a hardware platform, comprising a processor and a memory; and
   instructions encoded within the memory to instruct the processor to:
   receive a peak power demand for a landing maneuver of a vertical takeoff and landing (VTOL) aircraft powered at least partly by a primary battery;
   receive flight profile data for a flight profile of the VTOL aircraft, and configuration data for the VTOL aircraft, wherein at least a portion of the flight profile data comprises payload data generated by a payload sensor installed on the VTOL aircraft;
   estimate power consumption of the flight profile in context of the configuration data, and estimate a peak power capacity available for the landing maneuver;
   provide an overweight notice if a value of the payload data is in excess of a threshold weight; and
   provide an error notice if the peak power capacity does not meet the peak power demand;
   determine a time and a rate at which to initiate recharging of the primary battery by a landing battery based at least in part on the peak power demand, a current state of charge of the landing battery, and a current state of health of the landing battery; and
   initiate the recharging of the primary battery by the landing battery at the determined time and rate.

2. The computing apparatus of claim 1, wherein the peak power demand includes a safety margin.

3. The computing apparatus of claim 1, wherein the flight profile data are preflight data.

4. The computing apparatus of claim 1, wherein the flight profile data are in-flight data.

5. The computing apparatus of claim 1, wherein estimating peak power capacity comprises accounting for a state of health of the primary battery.

6. The computing apparatus of claim 1, wherein the flight profile data comprise real or predicted operating temperature.

7. The computing apparatus of claim 1, wherein the error notice comprises a preflight notification that a planned flight does not meet a power demand.

8. The computing apparatus of claim 1, wherein the error notice comprises an in-flight notification that the flight profile cannot be safely completed.

9. The computing apparatus of claim 1, wherein estimating power consumption comprises a reverse energy integration, wherein the reverse energy integration comprises:
   starting with a state of charge predicted to provide the peak power demand;
   working backward through the flight profile to reach an estimated starting state of charge; and
   providing the error notice if the estimated starting state of charge is greater than an actual state of charge.

10. One or more tangible, non-transitory computer-readable storage media having stored thereon instructions executable by a processor for causing the processor to:
   receive, for a vertical takeoff and landing (VTOL) aircraft and an associated primary battery, battery data, flight profile data for a flight profile of the VTOL aircraft, and flight configuration data for the VTOL aircraft, wherein at least a portion of the flight profile data comprises payload data generated by a payload sensor installed on the VTOL aircraft;
   receive, for the flight profile data, an associated peak power demand for a landing maneuver;
   receive an instantaneous load input value;
   receive an instantaneous primary battery response value;
   estimate a peak power capacity of the primary battery during the landing maneuver, according to primary battery data, the flight profile data, the instantaneous load input value, the instantaneous primary battery response value, and the flight configuration data,
   wherein estimating the peak power capacity of the primary battery comprises a reverse energy integration, wherein the reverse energy integration comprises:
      starting with a state of charge needed to provide the peak power demand at the landing maneuver, wherein the state of charge needed to provide the peak power demand at the landing maneuver accounts for at least one of primary battery state data and a predicted operating temperature at the landing maneuver;
      working backward through the flight profile data in discrete increments to reach an estimated starting state of charge at a beginning of a flight profile comprising the flight profile data, wherein the estimated starting state of charge is a state of charge necessary to complete the flight profile and leave the primary battery in a desired final state of charge after execution of the landing maneuver; and
      providing an error notice if the estimated starting state of charge is greater than an actual state of charge;
   determine whether the flight profile can be successfully completed comprising comparing the peak power capacity to the peak power demand;

act on the determination;

determine a time and a rate at which to initiate recharging of the primary battery by a landing battery based at least in part on the peak power demand, a current state of charge of the landing battery, and a current state of health of the landing battery; and initiate the recharging of the primary battery by the landing battery at the determined time and rate.

11. The one or more tangible, non-transitory computer-readable media of claim 10, wherein estimating peak power capacity comprises accounting for internal battery impedance.

12. The one or more tangible, non-transitory computer-readable media of claim 11, wherein the internal battery impedance accounts for temperature, state of charge, and state of health.

13. The one or more tangible, non-transitory computer-readable media of claim 11, wherein accounting for internal battery impedance comprises querying a lookup table.

14. The one or more tangible, non-transitory computer-readable media of claim 11, wherein accounting for internal battery impedance comprises applying a numeric model.

15. The one or more tangible, non-transitory computer-readable media of claim 10, wherein determining whether the flight profile can be successfully completed comprises providing a preflight notification that a planned flight does not meet a power demand.

16. A computer-implemented method, comprising:

receiving, for a vertical takeoff and landing (VTOL) aircraft and a battery for the VTOL aircraft, battery data, flight profile data, and flight configuration data, wherein at least a portion of the flight profile data comprises payload data generated by a payload sensor installed on the VTOL aircraft;

receiving, for the flight profile data, an associated peak power demand on the battery for a landing maneuver of the VTOL aircraft;

receiving an instantaneous load input value;

receiving an instantaneous battery response value;

predicting a peak power capacity of the battery available for the landing maneuver, according to battery data, the flight profile data, instantaneous load input value, instantaneous battery response value, and flight configuration data, wherein predicting the peak power capacity comprises a reverse energy integration, wherein the reverse energy integration comprises:

starting with a state of charge needed to provide the peak power demand at the landing maneuver, wherein the state of charge needed to provide the peak power demand at the landing maneuver accounts for at least one of primary battery state data and a predicted operating temperature at the landing maneuver;

working backward through the flight profile data in discrete increments to reach an estimated starting state of charge at a beginning of a flight profile comprising the flight profile data, wherein the estimated starting state of charge is a state of charge necessary to complete the flight profile and leave the primary battery in a desired final state of charge after execution of the landing maneuver; and providing a first error notice if the estimated starting state of charge is greater than an actual state of charge;

determining whether the peak power capacity of the battery can meet the peak power demand for the landing maneuver; and if it is predicted that the peak power capacity of the battery cannot meet the peak power demand, providing a second error notice;

determining a time and a rate at which to initiate recharging of the primary battery by a landing battery based at least in part on the peak power demand, a current state of charge of the landing battery, and a current state of health of the landing battery; and initiating the recharging of the primary battery by the landing battery at the determined time and rate.

* * * * *